(12) United States Patent
Mangat et al.

(10) Patent No.: US 6,749,968 B2
(45) Date of Patent: Jun. 15, 2004

(54) METHOD FOR FABRICATING A THIN-MEMBRANE STENCIL MASK AND METHOD FOR MAKING A SEMICONDUCTOR DEVICE USING THE SAME

(75) Inventors: Pawitter Mangat, Gilbert, AZ (US); Joe Mogab, Austin, TX (US); Kenneth H. Smith, Chandler, AZ (US); James R. Wasson, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 285 days.

(21) Appl. No.: 09/927,024

(22) Filed: Aug. 9, 2001

(65) Prior Publication Data

US 2003/0031936 A1 Feb. 13, 2003

(51) Int. Cl.$^7$ ................................................. G03F 9/00
(52) U.S. Cl. ............................................................ 430/5
(58) Field of Search ................................ 430/5; 378/34, 378/35

(56) References Cited

U.S. PATENT DOCUMENTS

| | | | |
|---|---|---|---|
| 5,464,711 A | 11/1995 | Mogab et al. | 430/5 |
| 5,500,312 A | 3/1996 | Harriott et al. | |
| 5,523,185 A | 6/1996 | Goto | |
| 5,674,413 A | 10/1997 | Pfeiffer et al. | 219/121.25 |
| 5,770,336 A | * 6/1998 | Choi | 430/5 |
| 5,899,728 A | 5/1999 | Mangat et al. | 438/459 |
| 5,912,095 A | 6/1999 | Katakura | 430/5 |
| 5,935,739 A | 8/1999 | Bayer et al. | |
| 5,942,760 A | 8/1999 | Thompson et al. | 250/492.2 |
| 5,972,794 A | 10/1999 | Katakura | 438/704 |
| 6,004,700 A | 12/1999 | Greschner et al. | |
| 6,051,346 A | 4/2000 | Kornblit et al. | 430/5 |
| 6,063,246 A | 5/2000 | Wolfe et al. | 204/192.16 |
| 6,124,063 A | 9/2000 | Dauksher et al. | 430/5 |
| 6,140,020 A | 10/2000 | Cummings | 430/296 |
| 6,159,558 A | 12/2000 | Wolfe et al. | 427/523 |
| 6,221,537 B1 | 4/2001 | Thompson et al. | 430/5 |
| 6,261,726 B1 | 7/2001 | Brooks et al. | 430/5 |
| 6,316,151 B1 | 11/2001 | Kim et al. | |
| 6,648,347 B1 | 11/2003 | Rieg | |
| 2002/0001964 A1 | 1/2002 | Choi | |

FOREIGN PATENT DOCUMENTS

| | | |
|---|---|---|
| JP | 10010706 | 1/1998 |
| WO | WO 02/073682 A1 | 9/2002 |

OTHER PUBLICATIONS

Donald W. Pettibone et al., "UV Inspection of EUV and SCALPEL Reticles", 20$^{th}$ Annual BACUS Symp. on Photomask Tech.; Proceedings of SPIE, vol. 4186 (2001);0277–786X/01, pp. 241–249.

(List continued on next page.)

Primary Examiner—Mark F. Huff
Assistant Examiner—Saleha Mohamedulla
(74) Attorney, Agent, or Firm—Robert L. King

(57) ABSTRACT

A stencil mask (12 or 12') has both a thin membrane layer (106) and a stress controlled layer (104) for enabling electron and ion projection lithography at very small geometries. The thin membrane layer (106) is within a range of substantially forty to two hundred nanometers and is preferably silicon nitride, and the stress controlled layer is preferably a metal or a metal alloy. Annealing of the stress controlled layer (104) may be performed to obtain a desired stress characteristic. Semiconductors are made using the mask by projecting radiation through the thin membrane stencil mask and reduction optics (30) onto resist (44) formed on a plurality of die, the radiation forming a contrast image on the resist that is subsequently developed. Commercially available lithography equipment is compatible with the thin stencil mask.

27 Claims, 3 Drawing Sheets

OTHER PUBLICATIONS

Brian J. Grenon et al., "20$^{th}$ Annual BACUS Symposium on Photomask Technology", 20$^{th}$ Annual BACUS Symp. on Photomask Tech.; Proceedings of SPIE, vol. 4186 (2001); 0277-786X, pp. 717-723.

H.C.Pfeiffer et al., "Projection reduction exposure with variable axis immersion lenses: Next generation lithography", J. Vac. Sci. Technol. B 17(6), Nov./Dec. 1999 American Vacuum Society, pp. 1-7.

S. Kawata et al., "Stencil reticle development for electron beam projection system", J. Vac. Sci. Technol. B 17(6), Nov./Dec. 1999 American Vacuum Society, pp. 2864-2867.

I.W. Rangelow et al., "p-n junction-based wafer flow process for stencil mask fabrication", J. Vac. Sci. Technol. B 16(16), Nov./Dec. 1998 American Vacuum Society, pp. 3592-3598.

P. Hudek et al., "Directly sputtered stress-compensated carbon protective layer for silicon stencil masks", J. Vac. Sci. Technol. B 17(6), Nov./Dec. 1999 American Vacuum Society, pp. 3127-3131.

PCT/US02/24164 Search Report mailed Feb. 5, 2003.

* cited by examiner

METHOD FOR FABRICATING A THIN-MEMBRANE STENCIL MASK AND METHOD FOR MAKING A SEMICONDUCTOR DEVICE USING THE SAME

RELATED APPLICATION

This application is related to U.S. patent application Ser. No. 09/122,710, entitled "Method of Forming A Semiconductor Device", now U.S. Pat. No. 6,297,169 issued on Oct. 2, 2001, filed by Pawitter Mangat et al. on Jul. 27, 1998 and assigned to the assignee hereof.

FIELD OF THE INVENTION

This invention relates generally to lithography masks used for patterning layers of integrated circuits, and more specifically, to methods for making a stencil mask as can be used in conjunction with electron projection lithography, ion projection lithography, electron proximity lithography, and ion proximity lithography.

BACKGROUND OF THE INVENTION

Electron projection lithography is a competing technology for future generations of lithography in semiconductor manufacturing (e.g. less than 70 nm feature sizes). Electron projection lithography projects electrons through a mask that has a pattern that correspond to the desired features to be patterned in a semiconductor wafer. In one form, the mask can have a continuous membrane through which the electrons pass, such as used in a technology known as SCALPEL® (SCattering Angular Limited Projection Electron Lithography). In another form, the mask membrane is discontinuous, having openings that correspond to desired features to be patterned in the semiconductor wafer. These are known as stencil masks. Stencil masks are also used for ion projection lithography that use ions as radiation source instead of electrons.

Existing stencil masks typically are formed from a silicon substrate, usually a silicon on insulator (SOI) substrate. Silicon is used as a support structure, and is also used to form a membrane layer that forms the stencil. The silicon membrane layer may be doped with boron or other dopant to control the stress in the membrane layer. A membrane window is formed by etching the silicon support structure, and the stencil pattern is formed by etching the silicon membrane layer. Typically, the silicon membrane layer has a thickness of approximately 1.5–3.0 πm when used in electron projection lithography applications. This thickness is required to provide a sufficient amount of electron scattering. In ion projection applications, the membrane layer is even thicker (approximately 1.5–10 πm). A thicker membrane layer is required in ion projection masks because the membrane window is usually much larger in area, thereby requiring more structural support.

There are two principal problems associated with existing stencil masks, both of which are related to the thickness requirements of the membrane layer. One problem is the ability to etch openings in the membrane layer that have high aspect ratios because it is difficult to control the sidewall profile of the opening through the membrane layer from top to bottom. The second problem is one known as image blur. As electrons or ions travel through a thick opening, some of the electrons or ions are drawn to the sidewalls of the opening due to interactions with the membrane materials. As a result, the electrons or ions passing through the opening are no longer as collimated as upon entering the mask opening. This causes the final projected image to be blurred in comparison to the desired pattern.

Materials other than silicon have been proposed for use as membrane layers. For example, U.S. Pat. No. 6,261,726 B1 by Brooks et al. proposes using a diamond, silicon carbide, diamond-like carbon, amorphous carbon, carbon nitride, or boron nitride to enhance the structural integrity of the membrane layer. However this patent requires a stencil membrane thickness of 0.5–5.0 πm, and therefore also suffers from the aforementioned problems.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
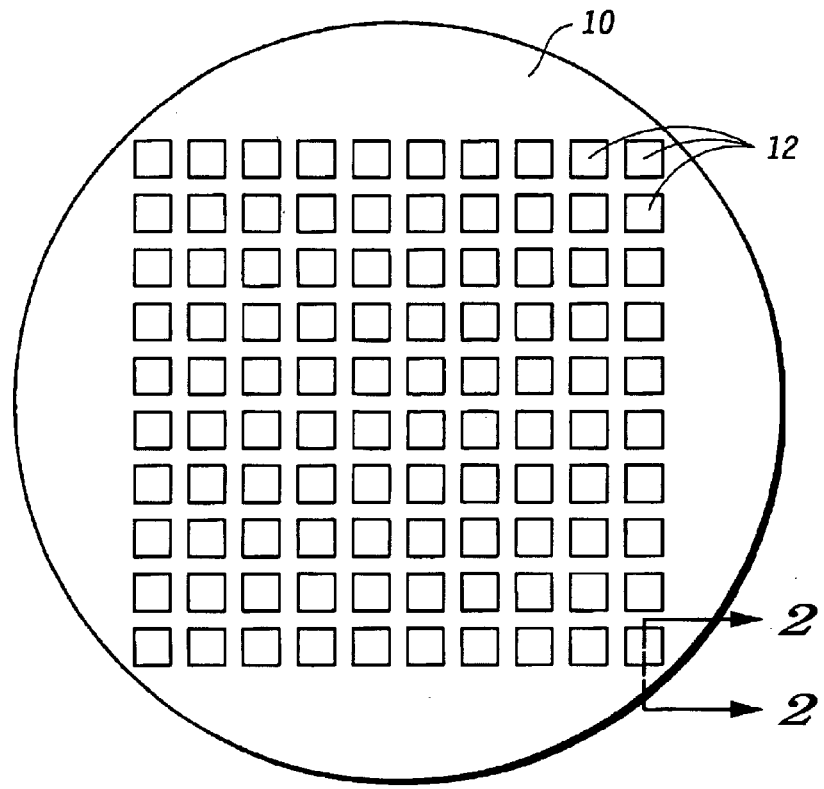
FIG. 1 illustrates a top down view of a stencil mask in accordance with the present invention.

FIG. 1 illustrates in a top view a stencil mask 10 in accordance with one embodiment of the present invention. Materials used to make the mask are described in detail below. Mask 10 includes a plurality of membrane windows 12. The number and size of membrane windows 12 will vary, depending upon the size of the semiconductor die to be patterned and the strength of the membrane layer material. In a typical electron projection application, the size of membrane windows 12 in a stencil mask is approximately 1 mm by 1 mm, but the present invention has been proven to support windows of 1 mm by 12 mm. The availability of total membrane area defines the die size that can be printed. Hence, a larger membrane area is desired. Together, all membrane windows on the mask define a single patterned layer to be transferred onto a semiconductor die.

Figure 2:
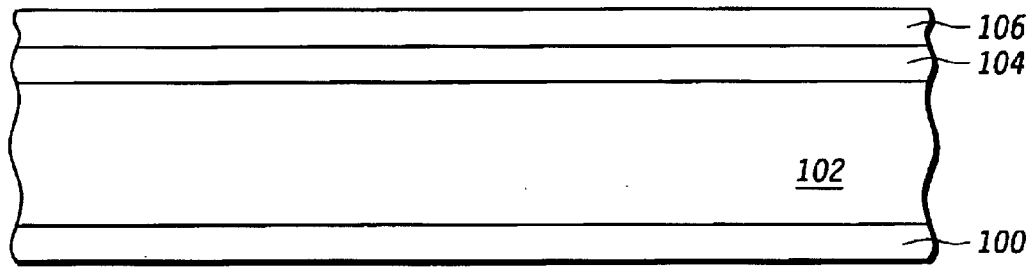
FIGS. 2–5 illustrate, in cross-section, a portion of the stencil mask of FIG. 1, taken along the line 2—2 as it undergoes a series of processing steps used to make the mask.

FIGS. 2–5 illustrate a series of process steps used to make mask 10. These figures are taken along the line 2—2 of FIG. 1. As shown in FIG. 2, mask 10 includes a support substrate 102 that is preferably comprised of silicon. Silicon is preferred simply because it is readily available in wafer form and it is easily processed using well understood semiconductor manufacturing techniques. However, other materials may be used for support substrate 102 in lieu of silicon. A hard mask layer 100 is formed on one side (the bottom side or secondary surface) of support substrate 102, and a thin membrane layer 104 is formed on the other side (the top side or primary surface). In a preferred embodiment, both the hard mask layer 100 and the thin membrane layer are comprised of silicon nitride ($Si_3N_4$). Accordingly, both layers can be formed simultaneously, for example using low pressure, chemical vapor deposition (CVD). In accordance with the present invention, thin membrane layer 104 is deposited to a thickness within a range of approximately 40–200 nm, and more preferably to a thickness within a range of 50–80 nm. The hard mask layer has approximately the same thickness since both layers are formed at the same time. The function of hard mask layer 100 and thin membrane layer 104 are described further below.

After depositing thin membrane layer 104, a stress control layer 106 is deposited over the thin membrane layer 104. In a preferred embodiment stress control layer 106 is a layer of tantalum silicon nitride ($Ta_xSi_yN_z$, where x is a real number from 20–99, y is a real number from 0–80, and z-is a real number from 0–80, and where x, y, and z sum to 100). In the most preferred embodiment, the stoichiometric formula for the stress control layer 106 is $Ta_{36}Si_{14}N_{50}$. Other materials for the stress control layer are also suitable, including tantalum silicon oxide (TaSiO), chromium (Cr), tantalum nitride (without silicon-TaN), tungsten (W), or refractory metal compounds. In general, a stress control material comprises at least one metal. In other words, the stress control layer is either a metal or a metal alloy film. One desirable property for stress control layer 106 is that it has a high atomic number (e.g. greater than 50) for improved electron scattering ability. Another desirable property for stress control layer 106 is that it is amorphous in microstructure. It is also desirable for the stress control layer 106 to be easily deposited and etched, and that it withstand the chemical processing typically used to clean lithography masks (e.g. peroxides, sulfuric acid, hydrochloric acid, and the like).

When a tantalum silicon nitride material is used for stress control layer 106, it is preferably deposited by RF sputtering to a thickness in a range of approximately 5–60 nm, and more preferably 30 nm. A minimum thickness of stress control layer 106 is determined by the material's scattering ability. The material has to scatter electrons sufficiently to create a high contrast image at the point the image is projected on the semiconductor wafer surface. Ideally, the stress control layer should be made as thin as possible to avoid the problems associated with thick membrane stencil masks as described in the background.

As its name suggests, stress control layer 106 is used to control the stress of membrane layer. If the stress level in thin membrane layer 104 is too high, it will have a tendency to break or rupture upon forming the openings in the membrane. The stress control layer is used to adjust the overall stress in the mask membrane such that a combined stress of stress control layer 106 and thin membrane layer 104 is in a range of approximately 0–150 MPa. The principle of force balancing is used to achieve this result. For example, the stress level of thin membrane layer 104 as deposited may be tensile, and the stress control layer 106 could be made compressive, with the amount of stress in the stress control layer being dependent on its thickness and the thickness of the thin membrane layer. To achieve a particular stress level or predetermined stress factor in stress control layer 106, deposition parameters can be adjusted or the film may undergo post-deposition processing (e.g. an anneal step) during manufacture of the thin membrane stencil mask. Also, stress control can be achieved by using a combination of compressive and tensile properties of the thin membrane layer 104 and the stress control layer 106.

Figure 3:
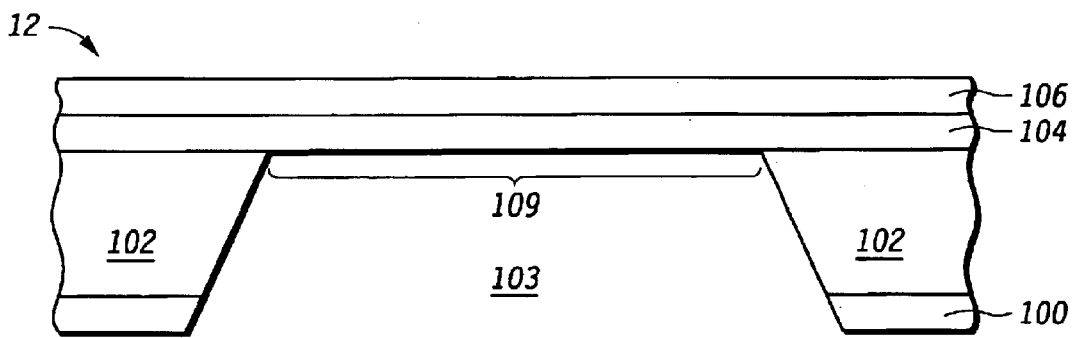

After deposition of stress control layer 106, mask 10 is etched from the backside (also referred to as the bottom side or secondary surface) to create one or more cavities extending to the thin membrane layer 104 such as cavity 103. Cavity 103 is defined in part by a window portion 109 in support substrate 102 as illustrated in FIG. 3. Window portion 109 defines the boundaries of the membrane windows 12 of the stencil mask. To create window portion 109, hard mask layer 100 is patterned and etched selectively to the support substrate material. For example, a $CHF_3$ chemistry could be used to plasma etch a silicon nitride hard mask selective to a silicon support substrate. The mask is then subjected to a wet KOH etch to define window portion 109. A KOH etch is selective to a silicon nitride so that the etch stops on and does not affect membrane layer 104. As shown, the window portion 109 has tapered sidewalls as a result of the crystallographic orientation of the silicon substrate material (which is typically oriented on a 100 crystal plane). As an alternative to a wet etch to define window portion 109, a dry etch could be used which would result in vertical sidewalls. This would require the addition of an etch stop layer (e.g. a silicon dioxide layer) between support structure 102 and thin membrane layer 104. This additional layer is preferably removed after forming window portion 109 so that it does not form part of the membrane. Also if using a dry etch, the choice of material for hard mask 100 may differ. For example, a silicon dioxide layer could be used in place of silicon nitride to get a more selective etch. A dry etch method is generally more costly to process because it employs steps, but it enables individual membrane windows to be placed closer together and therefore enables a larger die to be patterned.

Figure 4:
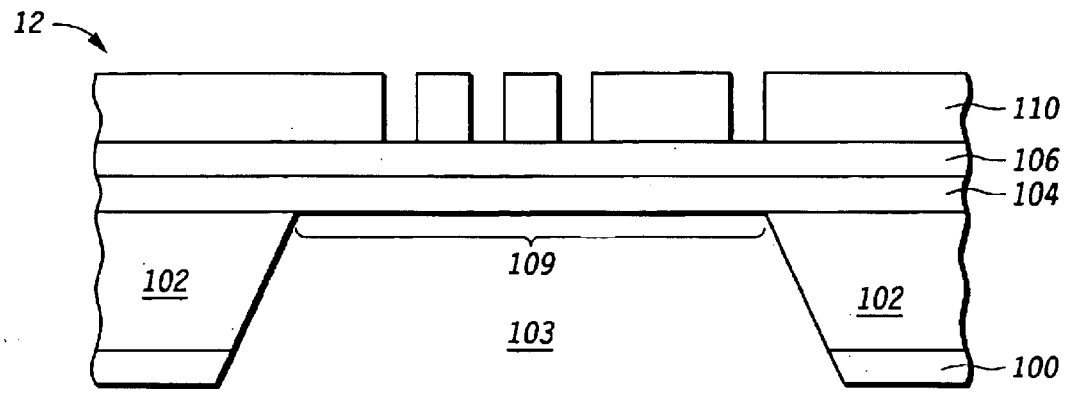
Figure 5:
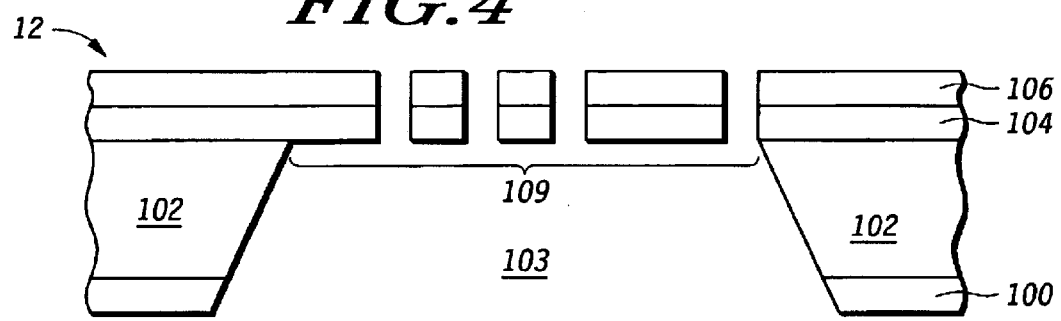

After the window opening is formed, the membrane layer and stress control layer are patterned to create the stencil. A semiconductor device layer pattern is used to form one or more openings in thin membrane layer 104 and stress control layer 106 thereby forming a stencil pattern in the mask. The pattern is formed by depositing and patterning a resist layer 110 over stress control layer 106 as shown in FIG. 4. This is performed in a conventional manner. The pattern of resist layer 110 corresponds to the desired patterned to be etched in the membrane layer. After forming and patterning resist layer 110, the mask is subjected to a dry etch. The chemistry of the dry etch is dependent on the particular materials used for the stress control layer and membrane layer. Preferably these two layers are etched together using the same chemistry that etches both materials. For example, if using a tantalum silicon nitride material for stress control layer 106 and silicon nitride for thin membrane layer 104, a chlorine ($Cl_2$) chemistry can be used. Rather than etching both layers at the same time, two different etch steps could be used. For example, if chromium were used as the stress control layer it would be etched using a mixture of chlorine and oxygen ($Cl_2$ and $O_2$). But such a mixture will not readily etch a silicon nitride membrane layer, so the etch chemistry can be changed to a chlorine-only or fluorine-based etch chemistry.

At this point the mask fabrication is complete and the mask is cleaned and inspected for defects. The present invention has an advantage over conventional stencil masks in that it can be inspected using both transmission and reflection techniques. In prior art stencil masks, the large thickness of the openings in the mask, combined with the small width of the openings, prevents transmission of the illumination such that only reflection techniques can be used. Ideally, the contrast of one of the membrane layers (either the stress control layer or the membrane layer) exhibits a contrast greater than 40% at the inspection radiation wavelength (which is typically in a range of 157–800 nm).

Figure 6:
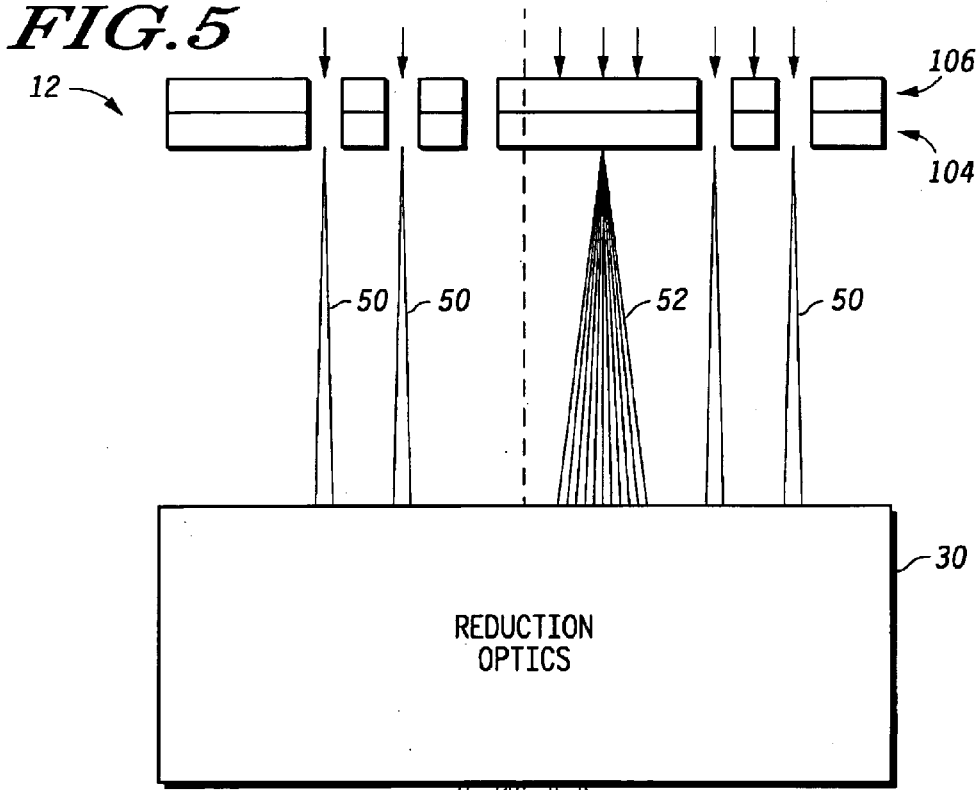
FIG. 6 illustrates, in a cross-sectional view, how the mask of FIGS. 1–5 is used to pattern a semiconductor wafer.
Figure 6:
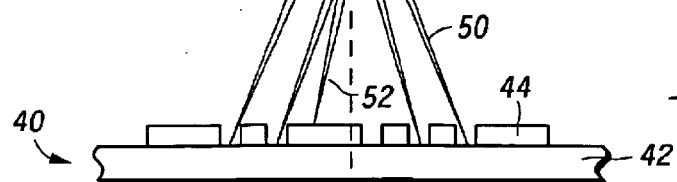

After approval of the mask, it can be used to pattern a semiconductor wafer as shown in FIG. 6. Only a portion of a membrane window, rather than the whole mask is depicted. Further, as illustrated in FIG. 6 the pattern of thin membrane layer 104 and stress control layer 106 does not match the pattern previously illustrated, but for purposes of understanding the invention this is not important. As shown in FIG. 6, electrons are projected without scattering through the openings in thin membrane layer 104 and stress control layer 106. Unscattered electrons are shown in FIG. 6 as electron beamlet 50. Elsewhere in the mask, electrons are scattered by the stress control layer 106, resulting in a scattered electron beamlet 52. Upon passing through reduction optics 30, all of the electrons are demagnified. However, the scattered electrons are stopped by a back focal plane aperture, while the unscattered electrons pass through the aperture. Only the unscattered electrons reach a semiconductor substrate 40 at an intensity level to expose the resist layer 44. The pattern of the unscattered electron beamlets is used to pattern a resist layer 44 on the semiconductor substrate. The pattern of resist layer 44 can then be transferred to the semiconductor substrate to form a part of a semiconductor device.

Figure 7:
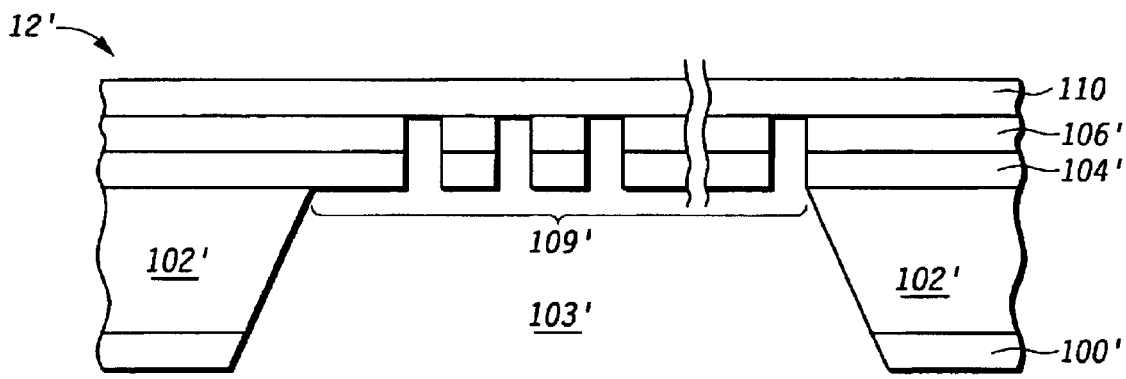
FIGS. 7–8 illustrate, in cross-section, a portion of a stencil mask in accordance with an alternative embodiment of the present invention.
Figure 8:
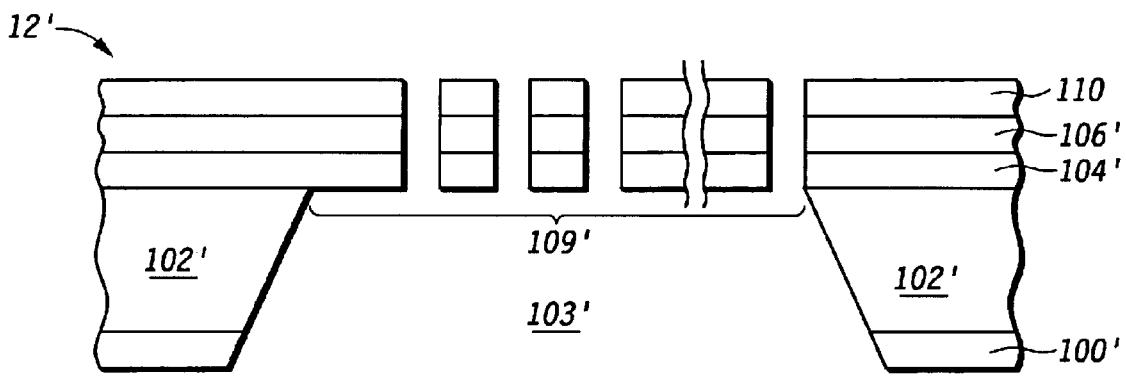

FIGS. 7 and 8 illustrate an alternative embodiment of the present invention in which a stencil mask is used for application in an ion projection lithography application. All elements of the masks shown in FIGS. 7–8 correspond to similarly numbered elements in previous figures. A difference is the addition of a carbon layer 110 over the stress control layer 106 and thin membrane layer 104. Carbon layer 110 is preferably deposited over the mask after forming the openings in the stress control and membrane layers. Carbon layer 110 is preferably deposited by sputtering to a thickness of between approximately 100–200 nm. Openings in the carbon layer 110 which correspond to the openings in stress control layer 106 and thin membrane layer 104 are formed by etching the mask from the backside (or bottom side or secondary surface) using the silicon nitride membrane layer as a hard mask for the etch. An $O_2$ plasma etch can be used to remove the carbon from within the openings, which is selective to silicon nitride. The resulting mask is shown in FIG. 8. The purpose of carbon layer 110 is to absorb the radiation ions that are used to illuminate the mask, thereby enhancing material stability of materials previously deposited. Ions pass through the openings in the mask but are absorbed elsewhere by the carbon layer. If ions penetrate into the stress control and membrane layers, it affects the stress levels in these films and can cause pattern distortion. By absorbing the ions with the carbon layer, such distortion is avoided. The break shown in mask 10' is intended to indicate that in ion projection lithography, the size of the membrane window 12' is typically larger than a membrane window used in electron projection lithography.

By now it should be appreciated that there has been provided a new stencil mask and method for its fabrication and use that overcomes the previously mentioned disadvantages associated with prior art masks. More specifically, a thin-membrane stencil mask (within a range of approximately 50–300 nm for the thin membrane layer and the stress control layer) reduces the problem of image blur because electrons have a much shorter distance to travel through openings in the mask. Additionally, the thin-membrane provides for easier fabrication in that consistent etch profiles from top to bottom of the openings are easier to control with shorter openings. Moreover, the present invention provides enhanced inspection capabilities in that both transmission and reflection mask inspection techniques can be used. A further advantage of the present invention is that mask repair can be more easily performed. It is easier to mill a thin-membrane silicon nitride material than conventional thick-membrane silicon and carbon materials. Similarly, it is easier to fill thinner-membrane films. The present invention is also attractive (both from an economic and manufacturing perspective) in that it utilizes known materials and processing steps to form the stencil mask such that conventional equipment sets and chemistries can be used.

Because the apparatus implementing the present invention is, for the most part, composed of electronic equipment and materials known to those skilled in the art, details regarding the raw materials will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A thin membrane stencil mask, comprising:
 a substrate having a primary surface and a secondary surface opposite the primary surface;
 a thin membrane layer overlying the primary surface of the substrate;
 a stress control layer overlying the thin membrane layer;
 an ion absorbing layer overlying the stress control layer for absorbing radiation ions to improve material stability of the stress control layer and the thin membrane layer;
 one or more cavities in the substrate extending from the secondary surface to the thin membrane layer; and
 a semiconductor device layer pattern having one or more openings in the stress control layer and the thin membrane layer, the one or more openings forming a stencil pattern in the thin membrane stencil mask.

2. The thin membrane stencil mask of claim 1 wherein the thin membrane layer has a thickness substantially in a range of 40–200 nanometers, and the stress control layer and thin membrane layer have substantially equal continuous widths between any two laterally successive openings.

3. The thin membrane stencil mask of claim 1 wherein the stress control layer has a thickness substantially in a range of five to sixty nanometers.

4. A thin membrane stencil mask, comprising:
 a substrate having a primary surface and a secondary surface opposite the primary surface;

a thin membrane layer overlying the primary surface of the substrate;

a stress control layer overlying the thin membrane layer;

an ion absorbing layer overlying the stress control layer for absorbing radiation ions to improve material stability of the stress control layer and the thin membrane layer;

one or more cavities in the substrate extending from the secondary surface to the thin membrane layer; and a semiconductor device layer pattern having one or more openings in the stress control layer and the thin membrane layer, the one or more openings forming a stencil pattern in the thin membrane stencil mask wherein a combined stress of the stress control layer and the thin membrane layer is in a range of 0 to 150 MPa.

5. The thin membrane stencil mask of claim 1 wherein a thickness of the stress control layer and the thin membrane layer in combination is between fifty and three hundred nanometers.

6. A thin membrane stencil mask comprising:

a substrate having a primary surface and a secondary surface opposite the primary surface;

a thin membrane layer overlying the primary surface of the substrate;

a stress control layer overlying the thin membrane layer, wherein the stress control layer is controlled to have a predetermined stress factor by annealing the stress controlled layer during manufacture of the thin membrane stencil mask and comprises a ternary compound material;

an ion absorbing layer overlying the stress control layer for absorbing radiation ions to improve material stability of the stress control layer and the thin membrane layer;

one or more cavities in the substrate extending from the secondary surface to the thin membrane layer; and a semiconductor device layer pattern having one or more openings in the stress control layer and the thin membrane layer, the one or more openings forming a stencil pattern in the thin membrane stencil mask.

7. The thin membrane stencil mask of claim 1 wherein stress control can be achieved by a combination of compressive and tensile properties of the thin membrane layer and the stress control layer.

8. The thin membrane stencil mask of claim 1 wherein the thin membrane layer is comprised of silicon nitride.

9. The thin membrane stencil mask of claim 1 wherein the stress control layer is comprised of a metal or a metal alloy film.

10. The thin membrane stencil mask of claim 9 wherein the stress control layer is comprised of TaSiN, TaN, TaSiO, Cr or W.

11. The thin membrane stencil mask of claim 1 wherein the stress control layer is amorphous in microstructure.

12. The thin membrane stencil mask of claim 1 wherein at least one of the stress control layer and thin membrane layer exhibit contrast greater than 40% at an inspection radiated wavelength substantially in the range of 157 nanometers through 800 nanometers.

13. The thin membrane stencil mask of claim 1 wherein the ion absorbing layer further comprises:

a layer of carbon and removed at the one or more openings.

14. The thin membrane stencil mask of claim 13 wherein the layer of carbon has a thickness substantially in a range of 100–200 nanometers.

15. A method of fabricating a thin membrane stencil mask comprising:

providing a substrate having a primary surface and an opposite secondary surface;

forming an overlying thin membrane layer adjacent the primary surface;

forming an underlying hard mask layer adjacent the secondary surface;

forming a stress control layer overlying the thin membrane layer for adding strength to the thin membrane stencil mask, wherein the stress control layer is formed such that a desired combined stress of the stress control layer and the thin membrane layer is in a range of 0–150 MPa;

etching one or more cavities through the hard mask layer and substrate and extending to the thin membrane layer;

defining a semiconductor device pattern in a resist layer overlying the stress controlled layer and the thin membrane layer, the semiconductor device pattern laterally overlying the one or more cavities;

using the resist layer as a mask to etch the stress control layer and the thin membrane layer to form stencil holes for the purpose of permitting a radiation source to freely pass through the stencil holes;

forming an ion absorbing layer overlying the stress control layer, the ion absorbing layer absorbing ions to improve material stability of the stress control layer and the thin membrane layer; and etching the ion absorbing layer at corresponding one or more openings in the stress control layer.

16. The method of claim 15 wherein the thin membrane layer has a thickness substantially in a range of 40–200 nanometers.

17. The method of claim 15 wherein the stress control layer has a thickness substantially in a range of five to sixty nanometers.

18. The method of claim 15 wherein the stress control layer is annealed to achieve the desired combined stress.

19. The method of claim 15 wherein a full thickness of both the stress control layer and the thin membrane layer is between fifty and three hundred nanometers.

20. The method of claim 15 wherein the stress control layer is controlled to have a predetermined stress factor by annealing the stress control layer during manufacture of the thin membrane stencil mask.

21. The method of claim 15 wherein stress control can be achieved by a combination of compressive and tensile properties of the thin membrane layer and the stress control layer.

22. The method of claim 15 wherein the thin membrane layer is comprised of silicon nitride.

23. The method of claim 15 wherein the stress control layer is comprised of a metal or a metal alloy film.

24. The method of claim 15 wherein the stress control layer is comprised of TaSiN, TaN, TaSiO, Cr or W.

25. The method of claim 15 wherein the stress control layer is amorphous in microstructure.

26. The method of claim 15 wherein at least one of the stress control layer and thin membrane layer exhibit contrast greater than 40% at an inspection radiated wavelength substantially in a range of 157 nanometers through 800 nanometers.

27. A thin membrane stencil mask, comprising:

a substrate having a primary surface and a secondary surface opposite the primary surface;

a thin membrane layer overlying the primary surface of the substrate;

a stress control layer overlying the thin membrane layer;

an ion absorbing layer overlying the stress control layer for absorbing radiation ions to improve material stability of the stress control layer and the thin membrane layer;

one or more cavities in the substrate extending from the secondary surface to the thin membrane layer; and a semiconductor device layer pattern having one or more openings in the stress control layer and the thin membrane layer, the stress control layer and thin membrane layer having substantially continuous depth between any two laterally successive openings the one or more openings forming a stencil pattern in the thin membrane stencil mask.

* * * * *